United States Patent [19]
Erhardt

[11] Patent Number: 5,051,797
[45] Date of Patent: Sep. 24, 1991

[54] CHARGE-COUPLED DEVICE (CCD) IMAGER AND METHOD OF OPERATION

[75] Inventor: Herbert J. Erhardt, Rochester, N.Y.

[73] Assignee: Eastman Kodak Company, Rochester, N.Y.

[21] Appl. No.: 402,311

[22] Filed: Sep. 5, 1989

[51] Int. Cl.[5] .................... H01L 29/78; H01L 27/14; H01L 31/00
[52] U.S. Cl. ........................ 357/24; 357/30; 358/213.19; 377/58; 377/60; 377/61; 377/62; 377/63
[58] Field of Search ............... 357/24 LR, 24, 24 M, 357/30 R, 30 D, 30 F, 30 H; 377/58, 60–63; 358/213.19

[56] References Cited

U.S. PATENT DOCUMENTS

| | | | |
|---|---|---|---|
| 4,155,094 | 5/1979 | Ohba et al. | 357/30 |
| 4,242,599 | 12/1980 | Suzuki | 357/24 LR |
| 4,390,888 | 6/1983 | Risch et al. | 357/30 |
| 4,467,341 | 8/1984 | Suzuki | 357/24 LR |
| 4,473,836 | 9/1984 | Chamberlain | 357/30 |
| 4,554,571 | 11/1985 | Arques | 357/24 |
| 4,644,572 | 2/1987 | Lambeth | 357/24 LR |
| 4,684,800 | 8/1987 | Morse et al. | 250/211 J |
| 4,685,117 | 8/1987 | Arques | 377/60 |
| 4,696,021 | 9/1987 | Kawahara et al. | 377/58 |
| 4,724,470 | 2/1988 | Van Santen et al. | 357/24 |
| 4,737,841 | 4/1988 | Kinoshita et al. | 357/24 LR |
| 4,774,557 | 9/1988 | Kosonocky | 357/24 LR |
| 4,914,493 | 4/1990 | Shiromizh | 357/24 LR |

FOREIGN PATENT DOCUMENTS

| | | | |
|---|---|---|---|
| 0026904 | 4/1981 | European Pat. Off. | 357/24 LR |
| 57-48260 | 3/1982 | Japan | 357/24 LR |
| 2103876 | 2/1983 | United Kingdom | 357/24 LR |

OTHER PUBLICATIONS

"The Pinned Photodiode for an Interline-Transfer CCD Image Sensor" by B. C. Burkey et al., published in the IEDM Technical Digest, 1984, pp. 28–31.

*Primary Examiner*—Andrew J. James
*Assistant Examiner*—Ngan Ngo
*Attorney, Agent, or Firm*—Donald D. Schaper

[57] ABSTRACT

A charge-coupled imager includes in a substrate of a semiconductor material a plurality of spaced photodetectors arranged in a line. The photodetectors are each of a type that can be completely depleted. A suitable photodetector is a pinned photodiode. A separate accumulation region is contiguous with one side of each of the photodetectors. A potential is applied to each accumulation region which forms an accumulation well therein which is lower than that in its respective photodiode so that charge carriers generated in the photodiode will continuously flow into the accumulation region. An anti-blooming drain is provided adjacent each accumulation region with the potential barrier between the anti-blooming drain and the accumulation region being below the potential well in the photodiode so that when the accumulation region fills with charge carriers to the level of the potential barrier any additional charge carriers will overflow into the anti-blooming drain. This maintains the level of the potential well in the accumulation region below that in the photodiode to allow the continuous flow of charge carriers from the photodiode into the accumulation region. A CCD shift register extends along the line of accumulation region and has a transfer gate which allows the charge carriers in the accumulation regions to be transferred into the shift register.

20 Claims, 2 Drawing Sheets

CHARGE-COUPLED DEVICE (CCD) IMAGER AND METHOD OF OPERATION

FIELD OF THE INVENTION

The present invention relates to a charge-coupled device (CCD) photodetector imager, and, more particularly, to such an imager in which the photodetector is continuously drained and which has anti-blooming features.

BACKGROUND OF THE INVENTION

Photodetector imagers, in general, comprise a plurality of photodetectors arranged in either a linear or area array. Along the linear array of the photodetectors or along each column of photodetectors in an area array is a transfer device for carrying the charge collected in the photodetectors to read-out circuitry. One transfer means commonly used is a CCD. The photodetectors commonly used are either a photogate detector or a photodiode detector. Both of these type of photodetectors are used in a variety of applications, but each presents certain tradeoffs in performance.

A photogate photodetector comprises a conductive gate over and insulated from a surface of a semiconductor substrate in which the imager is formed. A bias applied to the gate results in a depletion region in the substrate beneath the gate. Radiation entering the substrate is converted to charge carriers which are collected in the depletion region. The photogates exhibit reset characteristics which are free from lag and noise. However, they do suffer from poor quantum efficiency over much of the visible spectrum and tend to present photoresponse non-uniformity across a device because of gate thickness variation and/or depletion depth variation.

A photodiode photodetector comprises regions of opposite conductivity type in the substrate, one of which can be the substrate, forming a pn junction therebetween. Radiation entering the substrate is converted to charge carriers which are collected in the depletion region formed at the pn junction. Photodiode photodetectors tend to be more uniform than photogate photodetectors and exhibit very good quantum efficiency over the entire visible spectrum. However, they can exhibit lag and reset noise. In addition, both photogate and photodiode photodetectors suffer from time dependent response due to the collapse of the depletion region of the photodetector while photo-generated carriers are accumulated. That is, as the charge carriers are collected in the depletion region of the photodetector the depletion region becomes smaller until it is completely filled up.

It is desirable to have a photodetector which not only has good uniformity and good quantum efficiency, but also has time independent response and anti-blooming capability.

SUMMARY OF THE INVENTION

The present invention is directed to a CCD imager which includes at least one photodetector of the type which is capable of being completely depleted such as a pinned diode. Contiguous with the photodiode is an accumulation region having a potential well which is always deeper than the depletion region of the photodetector so that charge carriers collected in the photodetector will flow into the accumulation region. Adjacent a side of the accumulation region is a shift register (e.g., a CCD shift register). Between the accumulation region and the shift register is a transfer gate which allows selective transfer of the charge carriers from the accumulation region into the shift register. Adjacent another side of the accumulation region is an anti-blooming drain which limits the quantity of charge carriers which can be collected in the accumulation region.

The CCD imager of the present invention comprises a substrate of a semiconductor material having a major surface. A photodetector is in the substrate at the major surface and is capable of being completely depleted of charge carriers. An accumulation region is at the major surface of the substrate contiguous with the photodetector. A shift register is at the major surface of the substrate along one side of the accumulation region. Transfer means is provided between the accumulation region and the shift register for selectively transferring charge carriers from the accumulation region to the shift register. An anti-blooming drain is in the substrate at the major surface along another side of the accumulation region.

The invention will be better understood from the following more detailed description taken with the accompanying drawings and claims.

Figure 1:
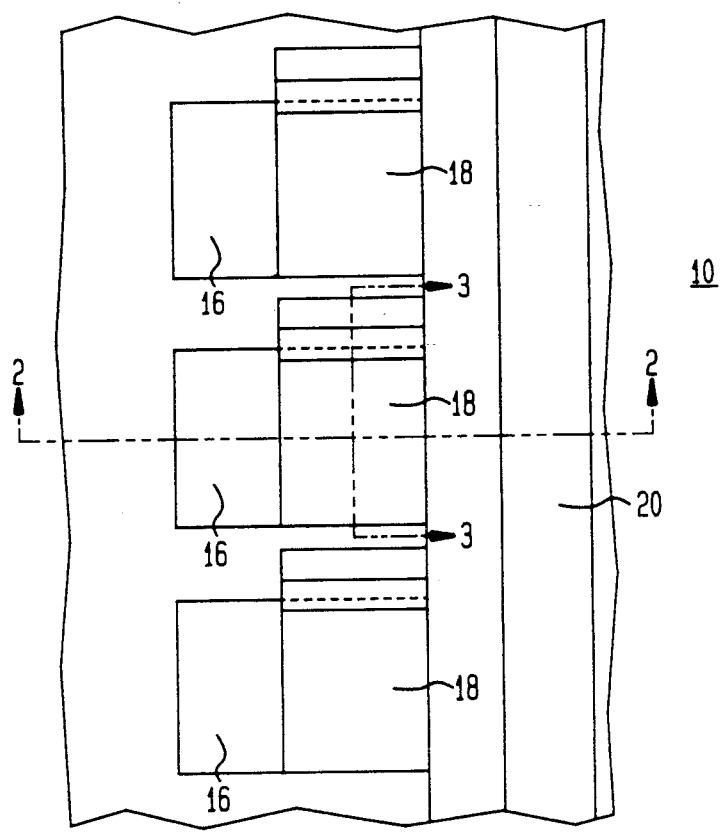
FIG. 1 is a top plan view of a portion of a CCD imager in accordance with the present invention.

It should be understood that the various FIGS. of the drawing are not necessarily drawn to scale.

DETAILED DESCRIPTION

Figure 2:
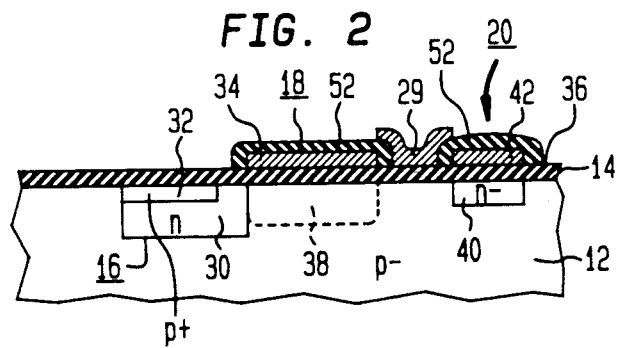
FIG. 2 is a sectional view of a portion of the imager taken along line 2—2 of FIG. 1.
Figure 3:
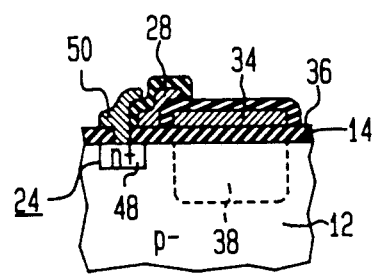
FIG. 3 is a sectional view of a portion of the imager taken along line 3—3 of FIG. 1.

Referring now to FIGS. 1, 2 and 3, there is shown a CCD imager 10 in accordance with the present invention. FIG. 1 is a top view and FIG. 2 is a cross-sectional view of a portion of FIG. 1 taken along the dashed line 2—2. FIG. 3 is a cross-sectional view of another portion of FIG. 1 taken along the dashed line 3—3. Imager 10 comprises a substrate (semiconductor body) 12, typically of a semiconductor material, such as p-type single crystalline silicon (shown as p—), having a major (top) surface 14. In the substrate 12 along the major surface 14 are a plurality of photodetectors 16. As shown, the photodetectors 16 are arranged in a line to form a linear array imager. However, the photodetectors 16 may be arranged in spaced rows and columns to form an area array. Contiguous to one side of each of the photodetectors 16 is an accumulation region 18. Extending along the side of the accumulation regions 18 opposite the photodetectors 16 is a CCD shift register 20. The shift register 20 extends along and substantially parallel to the entire line of the accumulation regions 18.

An anti-blooming drain 24 extends along a side of each of the accumulation regions 18 so as to extend along the space between the CCD shift register 20 and the line of photodetectors 16. A gate 28 extends across the space between each of the accumulation regions 18 and its respective anti-blooming drain 24. A transfer gate 29 extends across the space between the CCD shift register 20 and the line of accumulation regions 18 along the entire line of the accumulation regions 18.

Each of the photodetectors 16 is of the type which is capable of being completely depleted. As shown in FIG. 2, a preferred photodetector 16 for this purpose is a pinned diode photodetector of the type described in the article "The Pinned Photodiode For An Inter-Transfer CCD Image Sensor", by B. C. Burkey et al., IEDM Technical Digest, 1984, page 28. The pinned diode includes an n-type conductivity region 30, (shown as n) in the substrate 12 at the major surface 14. Typically the conductivity of region 30 is about $10^{17}$ impurities/cm$^3$. The substrate 12, which is of p-type conductivity, is typically of $10^{15}$ impurities/cm$^3$, or can have a p-type well in the surface 14 of an n-type conductivity substrate in which the photodiode is formed. A second, highly conductive, p-type conductivity region 32 (shown as p+), typically of a conductivity of $10^{18}$ impurities/cm$^3$, is within a portion of the first region 30 at the substrate surface 14.

Each of the accumulation regions 18 is formed by a gate 34 of a conductive material, such as a metal or conductive polycrystalline silicon. Each accumulation gate 34 is on a layer 36 of an insulating material, typically silicon dioxide, which is on and covers the substrate surface 14. Each of the accumulation gates 34 has an edge which is directly over an edge of the first region 30 of its respective photodiode 16. The accumulation gates 34 are connected by a bus line (not shown) to a source of potential (not shown) so that each accumulation gate 34 will create a potential well, indicated by dash line 38, in the substrate 12 beneath the gate 34. Since an edge of each accumulation gate 34 is directly over an edge of its respective photodiode 18, the potential well created by the accumulation gate 34 will be contiguous with the photodiode 18 as shown in FIG. 2.

The CCD shift register 20 may be of any well known construction. A buried channel configuration is shown in FIG. 2. The shift register 20 comprises an n-type conductivity channel region 40 (shown as n−) of impurity concentration of about $10^{17}$ impurities/cm$^3$ in the substrate 12 at the surface 14. The channel region 40 extends along the surface 14 spaced from and parallel to the line of the accumulation regions 18. Over the channel region 40 and on the silicon dioxide layer 36 are a plurality of conductive gates 42 which are spaced along the channel region 40. The gates 42 may be made of a metal or conductive polycrystalline silicon. The gates 42 are connected by bus lines (not shown) to a potential source (not shown) for selectively applying a potential to the gates 42 to operate the shift register 20.

As shown in FIG. 3, each of the anti-blooming drains 24 is a region 48 of n-type conductivity (shown as n+) of impurity concentration of about $10^{18}$ or higher impurities/cm$^3$ in the substrate 12 at the surface 14. Each drain region 48 extends along a side of its respective accumulation region 18 along the space between the CCD shift register 20 and the line of photodiodes 16. The drain regions 48 are connected to a source of potential through conductive contacts 50 and a bus line (not shown).

Each of the transfer gates 28 and 29 is a strip of a conductive material, such as a metal or conductive polycrystalline silicon, which is on the silicon dioxide layer 36. The transfer gate 29 extends over the space between the shift register 18 and the line of accumulation regions 18 and overlaps both the shift register gates 42 and the accumulation gates 34. The transfer gate 29 is insulated from the shift register gates 42 and the accumulation gates 34 by a layer 52 of silicon oxide which covers the shift register gates 42 and accumulation gates 34. As shown in FIG. 3, each of the anti-blooming drain gates 28 extends across the space between its respective accumulation region gate 34 and anti-blooming drain region 48.

Figure 4:
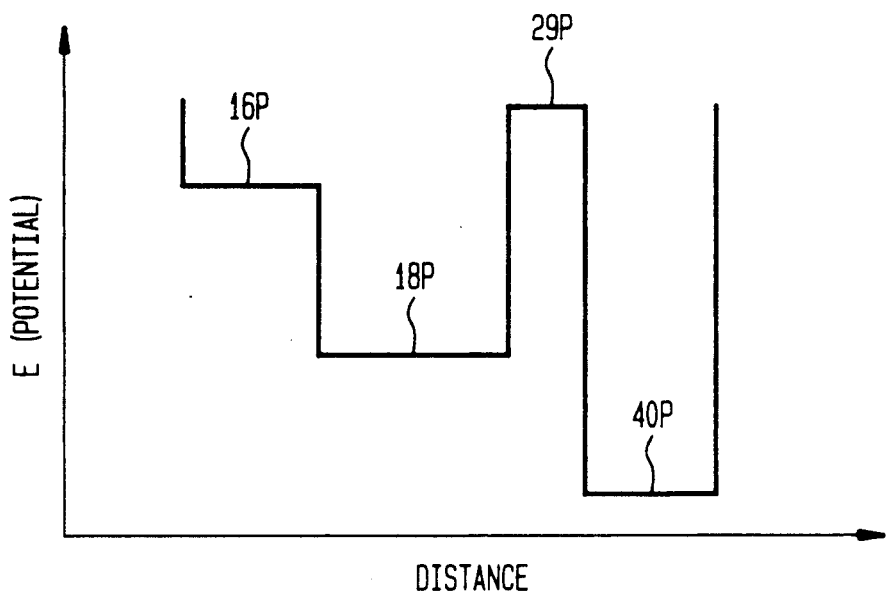
FIG. 4 is a potential diagram of the imager during integration taken along the section of FIG. 2.

In the operation of the image array 10, a potential is applied to the regions 30 and 32 of each photodiode 16 so as to completely deplete the regions of the photodiode 16. This creates a potential well 16P in each photodiode which remains at a uniform level in the photodiode, as is shown in FIG. 4. A potential is applied to each of the accumulation gates 34 so as to induce a potential well 18P in each accumulation region 18 which is deeper than the potential well 16P of the photodiode 16. Thus, during the integration period during which time the image array 10 is subjected to scene illumination, as charge carriers are generated in each photodiode 16, the charge carriers diffuse or drift into its contiguous accumulation region 18.

Figure 5:
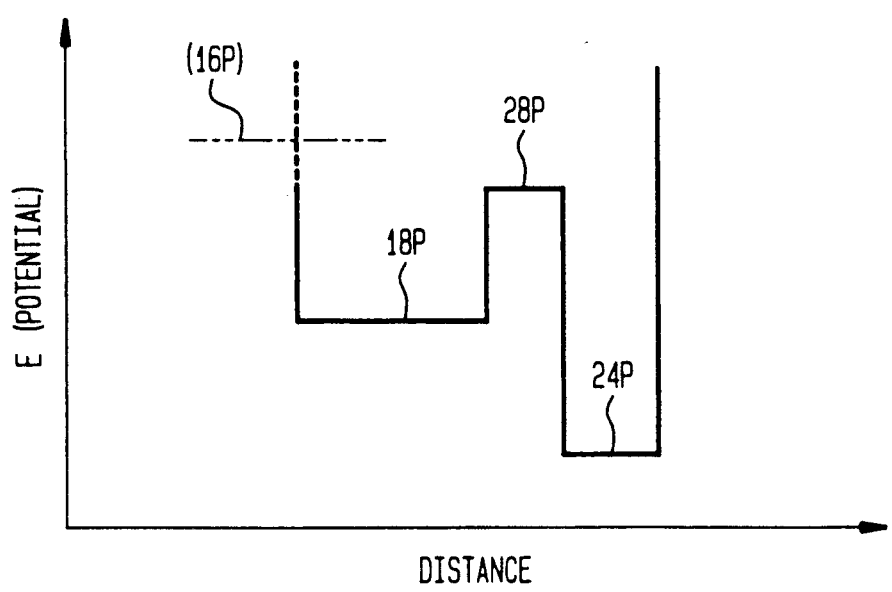
FIG. 5 is a potential diagram of the imager during integration taken along the section of FIG. 3.

As shown in FIG. 5, a potential is applied to each anti-blooming drain 24 so as to create a potential well 24P in the region 48 which is deeper than the potential well 18P in its adjacent accumulation region 18. A potential is also applied to the gate 28 which provides a barrier potential 28P which is lower than the potential 16P in the photodiode 16. Thus, if the charge carriers in the accumulation region 18 build up so that the potential in the accumulation region 18 reaches the level of the barrier potential 28P, any additional charge carriers entering the accumulation region 18 overflow into the anti-blooming drain 24. This maintains the potential in the accumulation region 18 always below the potential in the photodiode 16 so that charge carriers generated in the photodiode 16 always flow into the accumulation region 18 so that the potential 16P in the photodiode 16 is maintained at a continuous level. This in effect allows for time independent response of the photodiode.

During the transfer period, the image array 10 is operated in a manner normal for CCD transfer devices. A potential is applied to the transfer gate 29 which lowers the potential barrier 29P to a level low enough to allow the charge carriers stored in the accumulation region 18 to flow into the channel region 40 of the shift register 20 which is at a potential 40P below that of the accumulation regions 18.

Thus, in the operation of the imager 10 of the present invention, charge carriers created in the photodiodes 16 constantly flow into their adjacent accumulation regions 18. As the charge carriers flow into the accumulation regions 18, the channel potential and depletion depth in the accumulation region 18 is lowered. However, as long as the potential in the accumulation region 18 is higher than that of its adjacent pinned diode 16, the potential well in the accumulation region 38 is deeper than that in the photodiode 16. This results in the photodiode 16 operates with time independent response and suffers neither from lag or reset noise artifacts. Also, by having the barrier level between each accumulation region 18 and its adjacent anti-blooming drain 24 below the level of the potential well in the photodiode 16, a maximum number of charge carriers can be stored in the accumulation region 18 while still allowing the flow of charge carriers from the photodiode 16 into the accumulation region 18. Accordingly, the imager 10 of the present invention has all of the benefits of a pinned photodiode photodetector, including better uniformity and good quantum efficiency, as well as having time independent response and not suffering from lag or reset noise artifacts.

It is to be understood that the embodiments described herein are illustrative of the general principles of the invention. Modifications may readily be devised by those skilled in the art without departing from the spirit and scope of the invention. For example, although the imager 10 has been described as having a pinned photodiode as the preferred type of photodetector, any other type of photodetector which has a fully depleted well potential can be used.

What is claimed is:

1. A charge-coupled imager comprising:
   a substrate of a semiconductor material having a major surface;
   a photodetector in said substrate at said major surface, said photodetector being in a completely depleted condition during integration so as to form a depletion well of uniform depth in which charge carriers are generated when radiation is incident upon the photodetector;
   an accumulation region at said major surface contiguous with one side of said photodetector, said accumulation region including means for collecting and storing the charge carriers generated in the photodetector by said radiation and for maintaining said photodetector in said completely depleted condition during integration;
   a shift register at said major surface along a side of said accumulation region;
   means for selectively transferring charge carriers from the accumulation region into the shift register; and
   an anti-blooming drain in said substrate along another side of said accumulation region.

2. The charge-coupled imager of claim 1 in which the photodetector is a photodiode having a first region of one conductivity type in the substrate at the major surface and a second region of the opposite conductivity type in the substrate and within a portion of the first region.

3. The charge-coupled imager of claim 2 in which the photodiode is a pinned diode.

4. The charge-coupled imager of claim 3 in which the first region is of n-type conductivity and the second region is of p-type conductivity.

5. The charge-coupled imager of claim 3 in which the collecting and storing means in the accumulation region comprises a gate of a conductive material over and insulated from the major surface of the substrate with an edge of the gate being aligned over an edge of the first region of the photodiode.

6. The charge-coupled imager of claim 5 in which the anti-blooming drain comprises a region of a conductivity type opposite that of the substrate extending into the substrate from the major surface and extending along and spaced from a side of the accumulation region.

7. The charge-coupled imager of claim 6 in which the anti-blooming drain further comprises a gate of a conductive material over and insulated from the major surface and extending across the space between the accumulation region and the region of the anti-blooming drain.

8. The charge-coupled imager of claim 7 in which the shift register is a CCD shift register.

9. The charge-coupled imager of claim 8 in which the CCD shift register comprises a channel region of a conductivity type opposite that of the substrate within the substrate at said major surface, said channel region extending along but spaced from a side of the accumulation region, and a plurality of gates of a conductive material over and insulated from said major surface extending across and spaced along the channel region.

10. The charge-coupled imager of claim 9 in which the means for selectively transferring charge carriers from the accumulation region to the shift register comprises a transfer gate of a conductive material over and insulated from said major surface and extending across the space between the accumulation region and the channel of the shift register.

11. A charge-coupled imager comprising:
    a substrate of a semiconductor material having a major surface;
    a plurality of spaced photodetectors in said substrate at said major surface and arranged in a line along said major surface, each of said photodetectors being in a completely depleted condition during integration so as to form a depletion region of uniform depth in which charge carriers are generated;
    a separate accumulation region at said major surface contiguous with one side of each of said photodetectors, each of said accumulation regions being capable of forming a depletion region in said substrate deeper than that of its adjacent photodetector to continuously receive therein the charge carriers generated in the photodetector, each of said accumulation regions including means for maintaining its adjacent photodetector in said completely depleted condition during integration;
    a shift register at said major surface extending along a side of each of said accumulation regions;
    means for selectively transferring charge carriers from the accumulation regions into the shift register; and
    a separate anti-blooming drain in said substrate along another side of each of said accumulation regions.

12. The charge-coupled imager of claim 11 in which each of the photodetectors is a photodiode having a first region of one conductivity type in the substrate at said major surface and a second region of the opposite conductivity type in the substrate within the first region.

13. The charge-coupled imager of claim 12 in which each of the photodiodes is a pinned diode.

14. The charge-coupled imager of claim 13 in which the first region of each of the photodiodes is of n-type conductivity and the second region is of p-type conductivity.

15. The charge-coupled imager of claim 13 in which each of the accumulation regions comprises a gate of a conductive material over and insulated from the major surface of the substrate with an edge of the gate being aligned with an edge of the first region of its adjacent photodiode.

16. The charge-coupled imager of claim 15 in which each anti-blooming drain comprises a region of a conductivity type opposite that of the substrate extending into the substrate from the major surface and extending along and spaced from a side of its respective accumulation region.

17. The charge-coupled imager of claim 16 in which each anti-blooming drain further comprises a gate of a conductive material over and insulated from the major surface and extending across the space between the anti-blooming drain region and its respective accumulation region.

18. The charge-coupled imager of claim 17 in which the shift register is a CCD shift register.

19. The charge-coupled imager of claim 18 in which the CCD shift register comprises a channel region of a conductivity type opposite that of the substrate within the substrate at said major surface, said channel regions extending along but spaced from a side of each of the accumulation regions, and a plurality of gates of a conductive material over and insulated from said major surface extending across and spaced along said channel region.

20. The charge-coupled imager of claim 19 in which the means for selectively transferring charge carriers from the accumulation regions to the shift register comprises a transfer gate of a conductive material over and insulated from said major surface and extending across the space between the channel region and the accumulation regions.

* * * * *